United States Patent
Su et al.

(10) Patent No.: US 6,962,878 B2
(45) Date of Patent: Nov. 8, 2005

(54) METHOD TO REDUCE PHOTORESIST MASK LINE DIMENSIONS

(75) Inventors: Yih-Chen Su, Taichung (TW); Chao-Tzung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 223 days.

(21) Appl. No.: 10/417,704

(22) Filed: Apr. 17, 2003

(65) Prior Publication Data

US 2004/0209480 A1  Oct. 21, 2004

(51) Int. Cl.$^7$ ............................................. H01L 21/302

(52) U.S. Cl. ...................... 438/706; 438/719; 438/725; 438/735; 438/909; 438/948; 216/49; 216/58; 427/350; 430/313

(58) Field of Search .............................. 216/41, 49, 67, 216/58; 438/706, 719, 735, 909, 948; 427/331, 427/350, 369; 430/311, 313, 322

(56) References Cited

U.S. PATENT DOCUMENTS

| | | | | |
|---|---|---|---|---|
| 5,472,564 A | * | 12/1995 | Nakamura et al. | 216/51 |
| 6,630,288 B2 | * | 10/2003 | Shields et al. | 430/313 |
| 2004/0079727 A1 | * | 4/2004 | Taylor et al. | 216/67 |
| 2004/0161943 A1 | * | 8/2004 | Ren et al. | 438/758 |

OTHER PUBLICATIONS

Rossnagel et al., Handbook of Plasma Processing, 1990, Noyes Publications, p. 198.*

* cited by examiner

*Primary Examiner*—Nadine G. Norton
*Assistant Examiner*—Eric B. Chen
(74) *Attorney, Agent, or Firm*—Slater & Matsil, L.L.P.

(57) ABSTRACT

A method for reducing the dimension of a patterned organic photoresist area by reducing the pressure of a reactive environment surrounding the patterned photoresist to cause outgasing. The outgased materials $C_xH_yO_z$ are then decomposed in the reactive environment leaving the outgased photoresist porous. The environment surrounding the patterned photoresist is then increased to atmospheric pressure, which compresses or shrinks the porous photoresist. Photoresist lines having a dimension as small as about 0.085 μm can be obtained.

19 Claims, 3 Drawing Sheets

METHOD TO REDUCE PHOTORESIST MASK LINE DIMENSIONS

TECHNICAL FIELD

The present invention relates generally to a process for the reduction of feature dimensions in semiconductor devices, and more particularly to a method of shrinking or compressing the dimensions of areas or lines of patterned organic photoresist. The process may be applied to patterned organic photoresist masks regardless of the technique used to create the photoresist line, and is especially useful to reduce photoresist dimensions resulting from prior art lithography techniques. Test results have indicated that the method of the present invention can reduce or trim a photoresist line on the order of an additional 10–20%. For example, a 0.100 μm dimension across a line can be reduced to about 0.080 μm.

BACKGROUND

As will be appreciated by those skilled in the art, older lithography techniques for patterning photoresist masks used in etching semiconductor devices can routinely achieve line or area dimensions down to about 0.180 to 0.150 μm. These 0.180 to 0.150 μm features can then be further reduced by etch trimming of the photoresist down to about 0.100 μm. Newer lithography techniques based on lasers with shorter wavelengths can achieve dimensions of about 0.105 μm which can then also be etch trimmed down to about 0.090 to 0.085 μm. Although even more advanced laser techniques may allow further reduction of photoresist dimensions, persons skilled in the art recognize that absent some unexpected laser or etch trimming technology breakthroughs, the dimension or photoresist masking is approaching its theoretical limits.

Therefore, it would be advantageous if a technique other than laser lithography and/or etch trimming can be used to further reduce the line or area dimensions of a photoresist mask. The present invention provides a novel technique that can further reduce photoresist 100 μm line dimensions by an additional 10–20%. Furthermore, the techniques of the present invention can be used to further reduce the line dimensions even after other prior art etch trimming techniques have been employed.

SUMMARY OF THE INVENTION

The present invention provides a process for providing reduced dimensions of patterned areas of photoresist which in turn can provide for decreased dimensions of polysilicon gates or other semiconductive features. The process comprises providing patterned areas of an organic photoresist over a material such as for example a polysilicon layer. The polysilicon layer typically covers the surface of a silicon wafer. The wafer with the polysilicon layer and the photoresist along with an "exposed" source of silicon is placed in an enclosure or chamber suitable for being subjected to a vacuum. One suitable source of "exposed" silicon is a previously etched wafer. An etching mixture such as for example HBr and $O_2$ plasma is introduced into the chamber. It is believed this plasma environment and the exposed silicon combine to temporarily form a "reactive environment" of $SiBr_xO_{y(solid)}$ and $HbrO_{(gas)}$. The pressure inside the enclosure is reduced to about "0" mTorr, which results in outgasing of organic elements such as $C_xH_yO_2$ from the photoresist. This outgasing leaves the photoresist with voids (i.e., the photoresist is porous). These outgased elements of $C_xH_yO_2$ then decompose or combine with elements comprising the "reactive environment." The environmental pressure inside the enclosure or chamber is then returned to atmospheric pressure (i.e., about 760 mTorr) such that the pressure difference of the voids and pores of the photoresist and the enclosure environment compresses or shrinks the outgased patterned areas of photoresist about 10–20%.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Older production lithography processes using 248 nm exposure tools were able to develop photoresist (PR) patterned masks with critical dimensions (CD) down to about 180 nm. More recent exposure tools and resist formulas routinely achieve CDs of 150 nm down to about 130 nm. However, logic applications often require even smaller gate width dimensions, necessitating further trimming of the developed photoresist before the resist pattern is transferred to the underlying film, i.e., before etching. Consequently, conventional lithography is used to spin, expose and develop photoresist patterns, and the line widths of the photoresist patterns are subsequently reduced or trimmed through plasma etching by known existing methods.

Figure 1A:
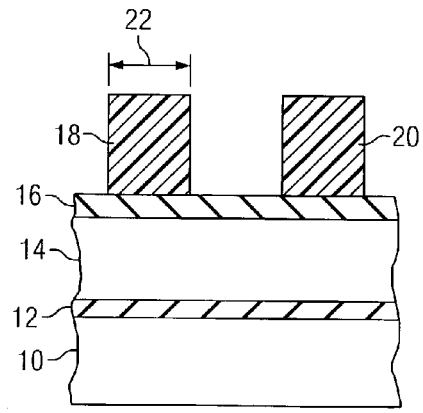
FIGS. 1A, 1B, 1C and 1D illustrate a prior art process for reducing the dimensions of photoresist for forming a polysilicon gate.
Figure 1B:
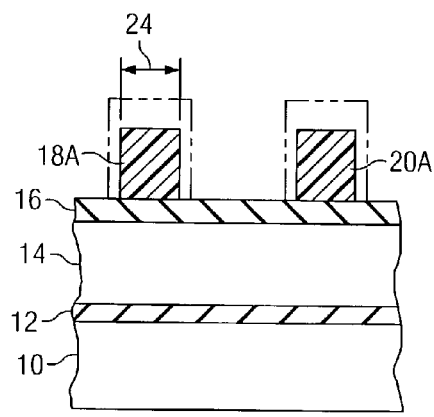
Figure 1C:
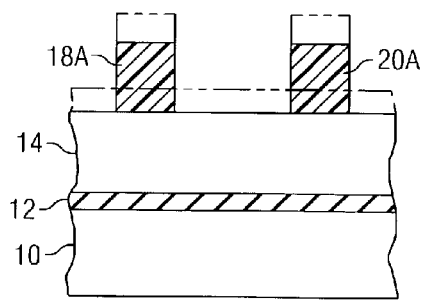
Figure 1D:
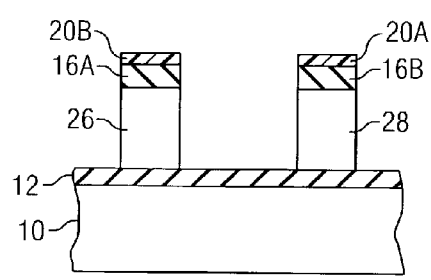

Prior art FIGS. 1A, 1B, 1C and 1D illustrate an example of the use of PR (photoresist) trimming to define a polysilicon gate. In the example, a nominal 160 nm polysilicon gate is reduced to 100 nm. As shown in FIG. 1A, a silicon wafer 10 includes a gate oxide layer 12 covered by a layer of polysilicon 14 suitable for forming a polysilicon gate in a semiconductor. In the prior art, a hardmask 16 typically formed of silicon dioxide or oxynitride was often used to cover the polysilicon layer 14. The patterned photoresist masks or areas indicated at 18 and 20 as formed by standard production lithography processes produce minimal line width of about 160 nm across as indicated by double-beaded arrow 22. These photoresist patterns are then used to mask the polysilicon during the etching process to form the polysilicon gate. FIG. 1B illustrates how the 160 nm mask areas 18 and 20 are then etched or trimmed to reduce the dimension as illustrated at 18A and 20A to about 100 nm as indicated by double-headed arrow 24. FIG. 1C illustrates how the hardmask 16 is removed while still maintaining a patterned photoresist mask to protect the polysilicon layer 14, and FIG. 1D illustrates how etch trimming of the polysilicon layer 14 with the photoresist mask in place forms the polysilicon gates 26 and 28 having a dimension of about 100 nm.

Although the prior art process discussed in FIGS. 1A–1D may be used to achieve photoresist line dimensions of about 100 nm, it would be advantageous to provide even smaller photoresist line dimensions for some applications. Furthermore, the etching process used to trim the photoresist as discussed with respect to FIGS. 1A–1D adds cost and the results are often non-uniform within a wafer. In addition, there is often significant deviation of the critical dimensions within a "lot" or group of wafers and etch trimming results in proximity effects due to micro loading that occurs during the etching process including mask etching. Proximity effects occur when dense pattern lines and isolated pattern lines are exposed at the same time. A common effect is that line dimensions are different even though the dimensions of the dense lines and the isolated lines on the layout mask or mask CD are the same. Other proximity effects include rounding of corners, shortening at the end of a line and non-linearity in line width.

When the shrink process of this invention is used without etch trimming to reduce photoresist line dimensions, the above-mentioned disadvantages can be avoided and processing costs significantly reduced. However, the shrink process of the present invention can also be advantageously used in combination with the prior art photoresist trimming processes to reduce or shrink the photoresist lines well below that obtained by the prior art trimming process alone. For example, the shrink process of this invention may compress the width of the photoresist line another 20 to 30 nm or a total width of between about 70 to 80 nm.

Figure 2:
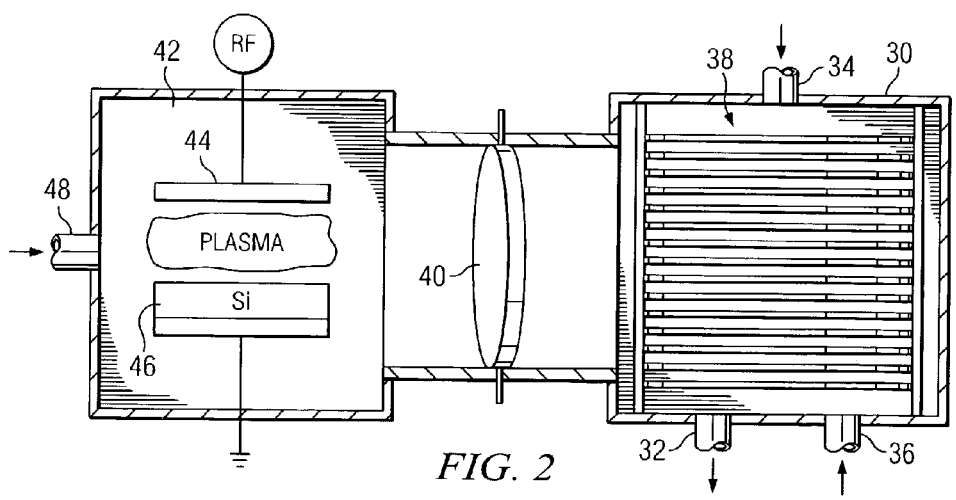
FIG. 2 is a schematic diagram illustrating processing equipment for practicing an embodiment of the present invention.

Referring now to FIG. 2, there is shown a schematic diagram of processing equipment suitable for use according to one embodiment of the processes of the present invention. As shown, an enclosure 30 is attached to a pumping device (not shown) by evacuation conduit 32. The enclosure or chamber 30 also includes a line 34 for providing a purge gas such as $N_2$ to the enclosure 30. A line 36 allows venting of the $N_2$ purge gas. The enclosure or chamber 30 includes racks or supports for holding cassettes 38 of wafers having a layer of polysilicon patterned by photoresist to be processed as will be discussed hereinafter. Connected to the enclosure 30 through a valve 40 is a second chamber 42 for creating a "plasma" between electronic plate or electrode 44 and a second electrode 46 made of silicon. A voltage of between about 10V and 300V and having an RF frequency of between about 5 MHz and 30 MHz is connected across electrode plate 44 and silicon electrode 46 as is well understood by those skilled in the art. A suitable etching gas containing HBr and $O_2$ is introduced into chamber 42 through conduit 48 and passes between the electrodes 44 and 46 so as to create a plasma as is also understood by those skilled in the art. A typical etching gas is comprised of HBr (or hydrogenbromide) along with other compounds such as for example, $Cl_2$, $CF_4$, and $HeNO_2$. As will be discussed hereinafter, the plasma produced in chamber 42 is introduced into the enclosure 30 so as to combine with chemical components which outgas from the patterned photoresist when the pressure inside the enclosure 30 is reduced from about 760 mTorr (atmospheric) to about "0" mTorr. Although the silicon electrode 46 as shown in FIG. 2 is believed to provide a simple way of including "exposed" silicon with the HBr and $O_2$ plasma, it should be understood that other sources of exposed silicon can also be used. For example, tests have indicated that previously etched wafers which include etched polysilicon layers over a silicon wafer can be included with the wafers covered by the patterned photoresist to obtain the desired shrinkage or compression of the photoresist lines.

Figure 3:
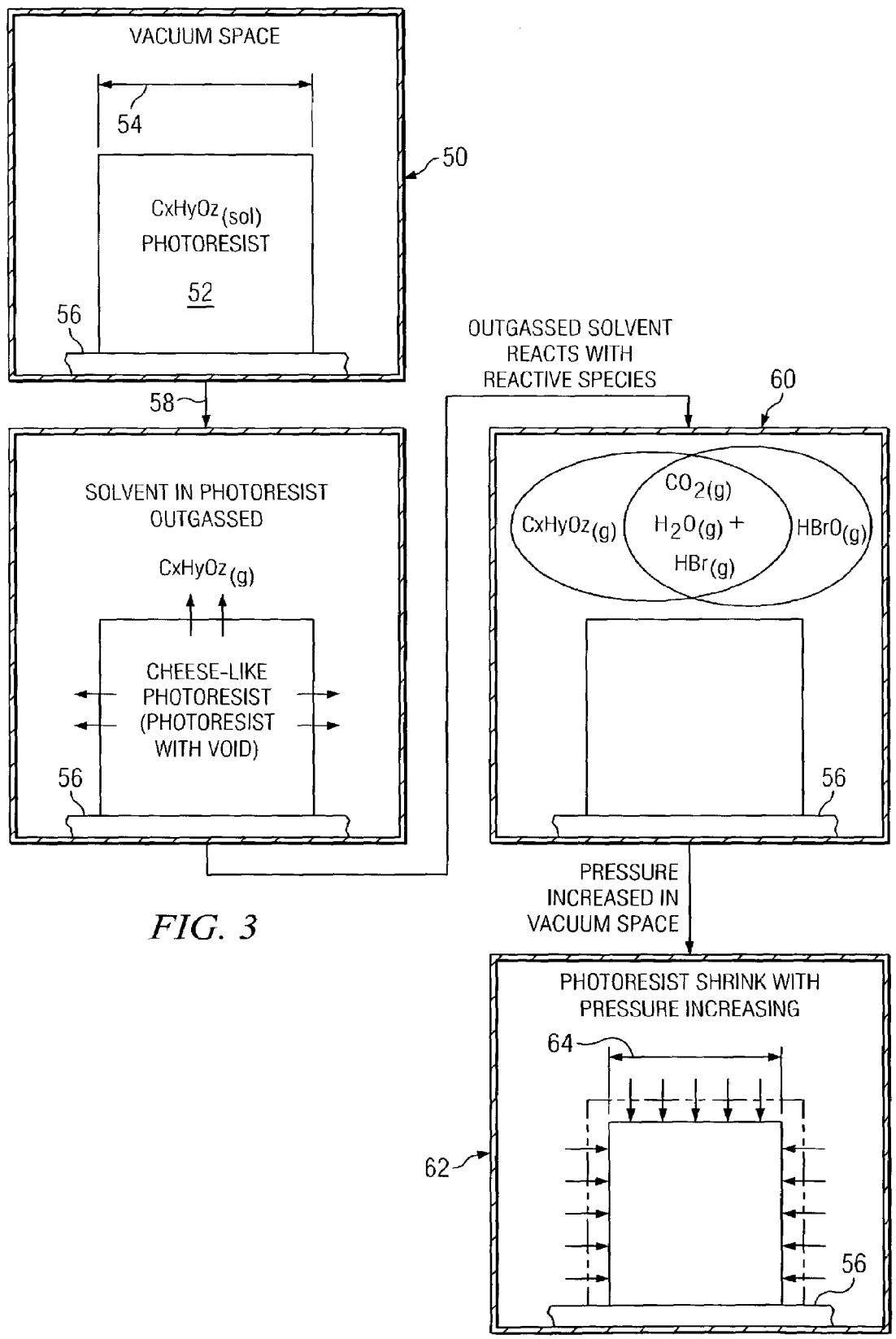
FIG. 3 is a functional flow diagram illustrating how the photoresist dimensions are reduced or shrunk according to one embodiment of the invention.

Referring now to FIG. 3, there is shown a functional flow diagram illustrating, as an example only, an embodiment of the invention. As shown at step 50, an area 52 of patterned organic photoresist having a dimension such as for example about 0.33 $\mu$m as indicated by double-headed arrow 54 is formed on a layer 56 of polysilicon such as is suitable for forming a polysilicon gate member. A suitable organic photoresist is "SEPR432" available from the Shin-etsu company of Japan and has been effective for use in this process. As will be appreciated by those skilled in the art, most organic photoresist materials such as SEPR432 typically include a solvent containing the elements of carbon, hydrogen and oxygen and can be identified as shown in FIG. 3 as $C_x$, $H_y$ and $O_z$. The combination or structure of patterned photoresist over polysilicon is placed in the enclosure or vacuum chamber 30 (as discussed with respect to FIG. 2).

A bare or exposed source of silicon is available to the plasma atmosphere or environment containing H (hydrogen), Br (Bromide), He (Helium) and O (Oxygen) such as a gaseous combination of HBr, He and $O_2$ where it reacts to produce a "reactive species" or "reactive compound." As illustrated in the embodiment of FIG. 2, the gaseous combination of HBr, He and O2 passes between the standard electrode 44 and the silicon electrode 46 to produce the plasma atmosphere, and consequently, the exposed source of silicon (i.e., electrode 46) is immediately adjacent the plasma as it is produced. This reactive species or compound is then provided from the plasma chamber 42 through valve 40 to enclosure 30 as is shown in FIG. 2. The enclosure is then evacuated as indicated at arrow 58 of FIG. 3 so as to reduce the environmental pressure surrounding the combination of the patterned photoresist and polysilicon layer from about 760 mTorr (atmospheric) to about 0 mTorr which results in the $C_xH_yO_z$ in the patterned organic resist outgassing into the reduced pressure of enclosure 30 where this $C_xH_yO_z$ in gaseous form reacts with the "reactive species" produced by the plasma and silicon.

More specifically, it is believed that the plasma gases He, $O_2$ and HBr react with the exposed silicon such as silicon electrode 46 to form hypobromous acid (HOBr) and a non-volatile polymer $SiBr_xO_{y(solid)}$. The chemical equation representing this reaction is believed to be:

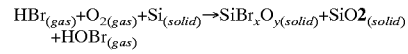

The gaseous $C_xH_yO_z$ outgased from the organic photoresist is believed to then react with the hypobromous ($HOBr_{(gas)}$) acid according to the equation as diagrammatically indicated at step 60 of FIG. 3 and the below equation.

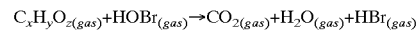

As a result of the outgasing and chemical reactions, the patterned area of photoresist is now porous (i.e., contains voids) and it is believed that the more outgased $C_xH_yO_z$ there is that can react with the HOBr, the more porous the photoresist. The pressure inside of the enclosure 30 is now increased from about 0 mTorr back to about 760 mTorr (atmospheric) as shown in step 62 such that the difference in pressures between the-voids or pores in the photoresist and the surrounding pressure 760 mTorr results in the photoresist being physically compressed or shrunk. According to the example discussed above, the photoresist dimension shrinks by about 0.02 μm to about 0.310 μm as indicated by double-headed arrow 64.

Figure 4:
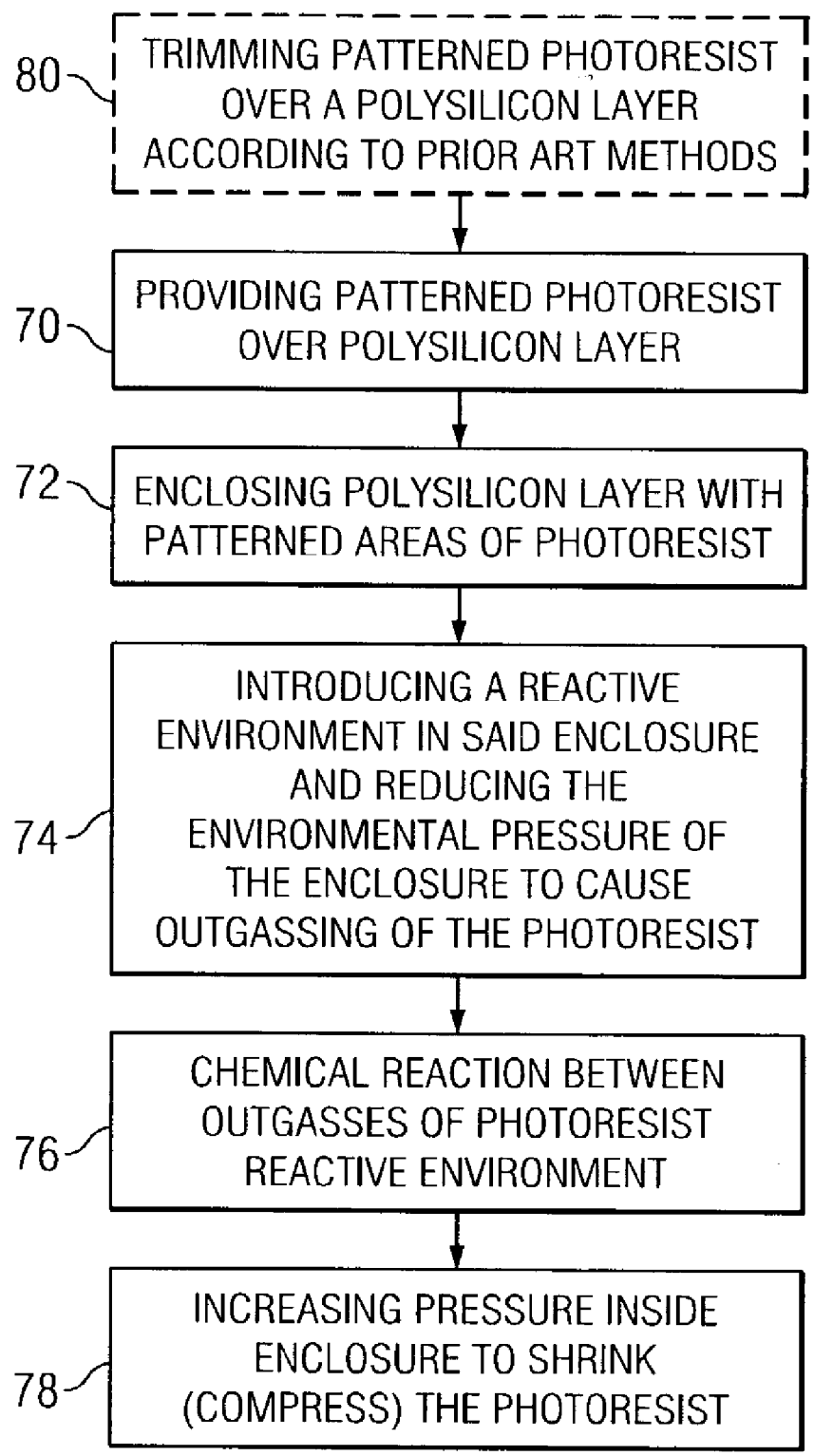
FIG. 4 is a flow chart illustrating process steps of one embodiment of the present invention.

Referring now to FIG. 4, there is a process flow diagram of steps according to the previously described embodiment of the present invention.

As shown at step 70, a combination of patterned areas of photoresist covering a polysilicon layer is provided. Typically the photoresist and polysilicon will be applied to a silicon wafer. This combination photoresist and polysilicon layer is then placed in an enclosure such as enclosure 30 of FIG. 3 and as indicated at step 72. Enclosure 30 is suitable for drawing a vacuum so as to reduce the environmental pressure inside the enclosure. As discussed above and illustrated in FIG 3, a reactive environment suitable for etching silicon such as a plasma formed by HBr and $O_2$ reacts with bare or exposed silicon to form a reactive compound or species HOBr and is provided in the enclosure. The environmental pressure inside the enclosure is then reduced to about 0 mTorr as indicated at step 74 such that the patterned areas of photoresist masking the polysilicon outgases. The components of the photoresist outgasing reacts or combines with the reactive environment as indicated by step 76. After the reactive species is created and combined with the products of the outgased photoresist, the patterned photoresist will include pores or voids. The pressure inside enclosure 30 is then increased as shown at step 78 such that the porous photoresist is compressed or shrunk. As indicated by step 80 in dotted lines, the process of this invention may also be used to further reduce the dimension of a patterned photoresist that has already been etched or trimmed by a prior art method. For example, tests have indicated that the process of this invention can further reduce a 100 nm line of photoresist down to about 75–80 nm.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, composition of matter, methods and steps described in the specification. As one of ordinary skill in the art will readily appreciate from the disclosure of the present invention, processes and methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A process for reducing the dimensions of previously patterned areas of photoresist comprising the steps of:
   providing patterned areas of organic photoresist;
   placing said patterned areas of organic photoresist in an enclosure;
   exposing a silicon containing material to a reactive environment suitable for etching said silicon containing material, and said reactive environment producing a reactive species;
   providing said reactive compound species into said enclosure and then reducing the environmental pressure of said enclosure such that components of said patterned areas of photoresist outgases and become porous;
   reacting components of said photoresist outgas with said reactive species; and
   increasing the environmental pressure around said outgased patterned areas of photoresist to compress said porous patterned areas of photoresist.

2. The process of claim 1 further comprising placing said exposed silicon containing material in said enclosure and introducing a silicon etching gas into said enclosure.

3. The process of claim 2 wherein said silicon etching plasma comprises H, Br, and $O_2$ such that a silicon containing product $SiBr_xO_{y(solid)}$ and HOBr is produced.

4. The process of claim 3 wherein said silicon etching gas comprising HBr and $O_2$ is HBr and an $HeO_2$ mix.

5. The process of claim 3 wherein said silicon etching gas comprises selected ones of the components HBr, $Cl_2$, $CF_4$, He and $O_2$.

6. The process of claim 2 wherein said patterned areas of photoresist are formed over an exposed polysilicon layer formed on a silicon wafer.

7. The process of claim 1 wherein said outgasing material is a solvent in said organic photoresist.

8. The process of claim 7 wherein said outgasing solvent includes Carbon, Hydrogen and Oxygen.

9. The process of claim 8 wherein said outgased Carbon, Hydrogen and Oxygen is a compound in the form of $C_xH_yO_z$.

10. The process of claim 9 wherein said reactive environment is a silicon etching gas comprising H, Br and $O_2$ such that said produced reactive species is HOBr, and wherein outgased $C_x$, $H_y$ and O combines with HOBr to yield $CO_2$, $H_2O$ and HBr.

11. The process of claim 1 wherein said step of reducing the environmental pressure comprises reducing the pressure from about 760 Torr to about 0 Torr.

12. The process of claim 1 wherein said step of increasing the environmental pressure comprises increasing the pressure from about 0 Torr to about 760 Torr.

13. The process of claim 1 further comprising the step of trimming said patterned area of photoresist prior to said step of providing patterned areas.

14. The process of claim 1 wherein said step of exposing silicon containing material to a reactive environment to produce the reactive species HOBr in said enclosure comprises the steps of supplying a silicon etching gas containing H, Br and $O_2$ to a chamber for generating a plasma, said chamber introducing at least one silicon electrode to form said HOBr.

15. The process of claim 14 wherein a polymer $SiBrO_x$ is formed along with the HOBr.

16. The process of claim 1 wherein said photoresist is compressed by 10% or greater.

17. The process of claim 16 wherein said photoresist is compressed between about 10% to 20%.

18. The process of claim 14 wherein said chamber for generating a plasma is a different enclosure than the enclosure where said patterned areas of organic photoresist are placed.

19. The process of claim 1 wherein said step of exposing a silicon containing material comprising the step of placing previously etched wafer in said enclosure with said patterned areas of organic photoresist.

* * * * *